United States Patent [19]

Ishihara et al.

[11] 4,357,582

[45] Nov. 2, 1982

[54] MICROSTRIP FET OSCILLATOR WITH DIELECTRIC RESONATOR

[75] Inventors: Osamu Ishihara; Tetsurou Mori; Hiroshi Sawano, all of Hyogo, Japan

[73] Assignee: Mitsubishi Denki Kabushiki Kaisha, Tokyo, Japan

[21] Appl. No.: 105,483

[22] Filed: Dec. 20, 1979

[30] Foreign Application Priority Data

Dec. 29, 1978 [JP] Japan .................. 53-161618

[51] Int. Cl.³ .............................................. H03B 5/18
[52] U.S. Cl. ................................. 331/96; 331/117 D
[58] Field of Search ...................... 331/96, 99, 117 D

[56] References Cited

U.S. PATENT DOCUMENTS 4,149,127 4/1979 Murakami et al. ......... 331/117 D X
4,187,476 2/1980 Shinkawa et al. ............. 331/117 D

FOREIGN PATENT DOCUMENTS 2816586 11/1978 Fed. Rep. of Germany ... 331/117 D

OTHER PUBLICATIONS

Ishihara et al., "A Highly Stabilized GaAs FET Oscillator," IEEE Transactions on Microwave Theory and Techniques, vol. MTT-28, Aug. 1980, pp. 817–824.

*Primary Examiner*—Siegfried H. Grimm
*Attorney, Agent, or Firm*—Sughrue, Mion, Zinn, Macpeak and Seas

[57] ABSTRACT

A microwave oscillator including a GaAs field effect transistor having a gate electrode, a drain electrode and a source electrode and disposed on a planar substrate. An elongated gate transmission line is connected to the gate electrode of the field effect transistor and disposed on the substrate and terminated by a matching impedance. An elongated drain transmission line is connected to the drain electrode of the field effect transistor and disposed on the substrate at a predetermined angle to the gate transmission line while an elongated source transmission line is connected to the source electrode and disposed on the substrate for providing the oscillating output. A dielectric resonator is disposed within an angle formed between the gate transmission line and the drain transmission line.

10 Claims, 11 Drawing Figures

MICROSTRIP FET OSCILLATOR WITH DIELECTRIC RESONATOR

BACKGROUND OF THE INVENTION

The present invention relates to a microwave oscillator using a FET. Microwave circuits including a high frequency transistor such as a GaAs FET or the like are usually formed with a planar circuit structure. This invention provides a new and improved construction of such a microwave oscillator formed with a planar circuit substrate.

FIGS. 1 through 5 show examples of structures of conventional oscillator circuits. With reference first to FIG. 1, the planar circuit structure of the conventional structure is formed by metal films, shown by shadowed sections in the drawings, disposed on a first surface of a substrate 1 which is made of alumina porcelain or the like. In addition, a ground conductor which is made of metal film is disposed over the entire second surface of the substrate 1 or at least on a part of the second surface opposite to the metal film disposed on the first surface of the substrate 1. When alumina porcelain is used as the substrate 1, a substrate of about 0.6 μmm thick is generally used. Metal films are usually formed by providing a layer of chromium having thickness of 500–1000 Å on the alumina porcelain, then coating it with layer of gold 4–5 μm thick with a vacuum evaporating or electroplating technique. A photo-etching technique, eliminating unnecessary metal films, is generally used for forming the planar circuit structure.

Referring now to FIG. 1, a GaAs FET 2 has three electrodes, namely a drain, gate and source. A transmission line 3 is connected to the gate electrode of the GaAs FET and a negative bias voltage is applied thereto. A transmission line 4 is connected to the source electrode of the GaAs FET and supplied with a zero bias voltage while a transmission line 5 is connected to the drain electrode of the GaAs FET and supplied with a positive bias voltage. The bias voltage supplying circuit is not shown. The oscillating frequency of such an oscillator is primarily determined by the length $l_1$ of the gate transmission line 3 which is selected to be one-half of the wavelength corresponding to the oscillating frequency. The length $l_2$ of the source transmission line 4 is selected to be a quarter-wavelength. The oscillating output is taken out from the drain transmission line 5.

The three electrodes the of GaAs FET may otherwise be connected to the transmission line other than with the connections described above. That is, the gate electrode of the GaAs FET may be connected to the line 3, the drain electrode of the GaAs FET to the line 4 and the source electrode of the GaAs FET to the line 5. Furthermore, for powering the oscillator, it is possible to use a single bias voltage source instead of two bias sources, one positive and the other negative as mentioned above. To this effect, the gate electrode of the GaAs FET is grounded and a suitable resistance, for example 10Ω, is disposed between the gate and source electrode of the GaAs FET and a positive voltage may be applied to the drain electrode of the GaAs FET. In the oscillator thus described, the external Q of the circuit is low (about several tens), much noise is generated, and the oscillator is easily affected by fluctuations in the load, voltage, ambient temperature and the like. Because of large changes of frequency caused by such fluctuations, there are difficulties in using such as oscillator.

FIG. 2 through FIG. 4 illustrate techniques for increasing the external Q and frequency stability of the oscillator. Referring to FIG. 2, a dielectric resonator 6 is disposed near a output transmission line 5. This dielectric resonator 6 acts as a band rejection filter (BRF) which stabilizes the oscillating frequency of the oscillator when the oscillating frequency determined by the length $l_1$ of gate transmission line 3 is close to the resonant frequency of the band rejection filter. In this way, a GaAs FET oscillator operating in a 11 GHz output band may have an external Q of more than 3000 and a frequency stability of ±300 KHz against environmental temperature variations from −10° to +50° C. A frequency change of about 50 to 60 MHz would be observed over the same temperature change without the BRF. In FIG. 3, showing a side view of FIG. 2, a metal plate 7 is spaced from a surface of dielectric resonator 6. The distance d between the dielectric resonator 6 and the metal plate 7 may be adjusted. (The metal plate 7 is not shown in FIG. 2 nor is a case containing a oscillator assembly and supporting the metal plate 7.) The resonant frequency of the dielectric resonator 6 may be adjusted by changing the distance d between the metal plate 7 and the resonator 6. In order to stabilize the oscillating frequency of the oscillator, it is necessary to use a dielectric resonator having a resonant frequency close to, and preferably somewhat lower than, the oscillating frequency determined by the length $l_1$ of the gate transmission line, and the distance d should be adjusted to obtain a suitable external Q. In FIG. 3, numeral 8 refers to a ground conductor.

FIG. 4 shows another example in which a dielectric resonator is placed near the gate transmission line 3. With the arrangement of FIG. 4, high stability of the oscillation is obtained.

In a conventional oscillator as shown in FIG. 1 through FIG. 4, the oscillating frequency is fundamentally determined by the length $l_1$ of the gate transmission line. Therefore, the conventional oscillator is not suitable for practical use since performing fine adjustment is very difficult after the planar circuit pattern has been fixed. Also, stabilization of the oscillator by means of a BRF is difficult in that the output of the oscillator decreases when both the external Q and the stability increase. Moreover, even through the output power of the oscillator is about 40 mW without a BRF, the output power drops below 10 mW if the external Q is increased by above about 2000 by using the BRF. In addition, it is difficult to produce a number of oscillators having the same performance because the location of the BRF, that is, the distance from the FET to the BRF and from the BRF to the line 5 strongly influences the characteristics of the oscillator, such as frequency, output power and the like. Yet further, a conventional oscillator has problems in production in that the characteristics of the oscillator are significantly affected by the combination of the line lengths $l_1$ and $l_2$.

FIG. 5 shows an example of a conventional oscillator intended for solving such problems. In FIG. 5, a source transmission line 4 is connected to a ground conductor through an aperture 9 which is formed in the substrate 1 near the FET 2. Oscillating output is taken out from a drain transmission line 5. A part of the output power which is taken out from the drain transmission line 5 through a line 51 is transmitted to a gate transmission line 3 by way of a dielectric resonator 6. In this case, the FET 2 acts as an amplifier amplifying repeatedly signals having a frequency able to pass the dielectric resonator 6, that is, the resonant frequency of the dielectric resonator. Therefore, as the stability of the frequency is determined by the stability of the dielectric resonator, it is theoretically possible to obtain an oscillator with high stability. Fine adjustment of the oscillating frequency may be also easily provided by adjusting the resonant frequency of the dielectric resonator as shown in FIG. 3.

Nonetheless, with the arrangement of FIG. 5, it is difficult to properly design the circuit. The oscillating operation strictly depends upon the length and structure of the gate transmission line 3 and the branch line 51 and the distances between the dielectric resonator 6 and these lines 3, 51. Yet further, oscillation at a frequency different from the predetermined frequency can sometimes occur. For these reasons, there are yet many difficulties in producing a oscillator which can be put into practical operation.

SUMMARY OF THE INVENTION

It is an object of this invention therefore to provide a new and improved microwave oscillator. More specifically, it is an object of the invention to provide a device with a wide tuning range and a high stability yet having a simple construction.

A further object of the invention is to provide a microwave oscillator with variable external Q at an arbitrary frequency within a tuning range.

This invention accomplishes these objects by the provision of a microwave oscillator including a planar substrate, a field effect transistor having a gate electrode, a drain electrode and a source electrode, all disposed on the substrate, an elongated gate transmission line connected with the gate electrode of the field effect transistor and disposed on the substrate and terminated by a matching impedance, an elongated drain transmission line connected with the drain electrode of the field effect transistor and oriented on the substrate at a predetermined angle to the gate transmission line, and an elongated source transmission line connected with the source electrode and disposed on the substrate and providing the oscillator output. A dielectric resonator is disposed within an angle formed between the gate transmission line and the drain transmission line.

BRIEF DESCRIPTION OF THE DRAWINGS

This invention will be more easily understood from the following detailed description taken in conjunction with the accompanying drawings in which.

DESCRIPTION OF THE PREFERRED EMBODIMENTS

Figure 6:
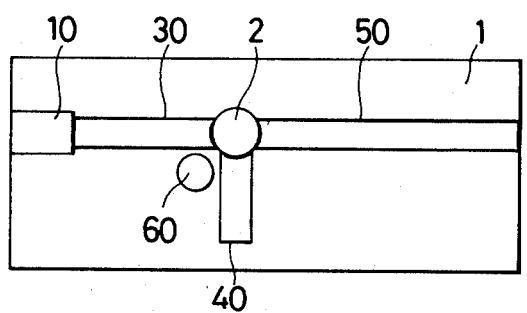
FIG. 6 is a front plan view of a first embodiment of a microwave oscillator according to the present invention.

Referring now to FIG. 6, a gate transmission line 30, a drain transmission line 40, a source transmission line 50 and a matching impedance 10 are illustrated. The gate transmission line 30, the drain transmission line 40 and the source transmission line 50 are connected to a gate electrode, a drain electrode and a source electrode of the GaAs FET 2, respectively. A particular feature of the invention resides in that a dielectric resonator 60 is placed within an adjacent angle formed between the gate transmission line 30 and the drain transmission line 40 and that the gate transmission line 30 is terminated with a matching impedance 10. Output power from the oscillator is taken out from the source transmission line 50. The angle between the source transmission line 50 and the drain transmission line 40 does not need to be a right angle although the angle between the gate transmission line 30 and the drain transmission line 40 should be a right angle. The dielectric resonator 60 is preferably placed apart from the gate transmission line 30 and the drain transmission line 40 by a short distance, preferably about 0.1 mm, so as to obtain a high external Q. It may, however, overlap those transmission lines if a low external Q is permitted.

The matching impedance 10, which is constructed of a chip resistor having a resistance equal to a characteristic impedance of the gate transmission line 30, normally selected to be 50Ω, has one end soldered to the gate transmission line 30 and the other end connected to a ground conductor on the other surface of the substrate 1.

One end of the drain transmission line 40 is opened. The length of the drain transmission line 40 is selected to be about one-half of the microwave wavelength. However, experiments have proved that a small deviation from one-half of the microwave wavelength does not significantly influence characteristics of oscillation. In FIG. 6, the drain transmission line 40 is provided on only one side of the FET 2 although the drain transmission line 40 may be provided on both sides of the FET 2.

As described above, the oscillator according to the present invention, which enables easy design and has a simple structure, is not influenced in its oscillating characteristics by deviations of the transmission lines in size which are inevitable in mass production. The oscillating frequency of the oscillator is determined by the resonant frequency of the dielectric resonator and is well stabilized.

Experiments on GaAs oscillators operating in the 11 GHz band constructed according to the present invention have shown an external Q of 1000–1500, an output power of 30–40 mW, a frequency deviation of 500 KHz over a temperature range of from −20° C. to 60° C., a tuning range of 600 MHz and an output deviation of less than 2 dB.

Figure 7:
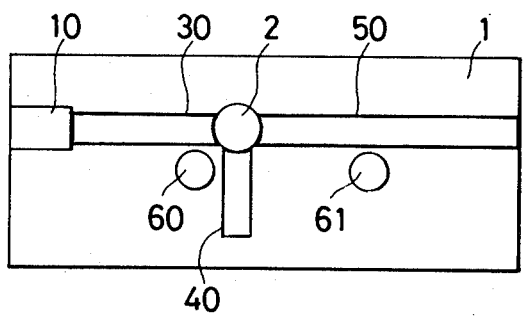
FIG. 7 is a front plan view of a second embodiment of a microwave oscillator according to the present invention.

In FIG. 7, there is shown an another embodiment according to the present invention which includes a second dielectric resonator 61 as a band rejection filter in addition to the structure shown in FIG. 6. This embodiment including the second dielectric resonator provides a greater stability and less noise. With this embodiment, the external Q may be varied at an arbitrary oscillating frequency within the tuning range.

In other words, an arbitrary value of the external Q may be set by adjusting the resonant frequency of the second dielectric resonator with the resonant frequency of the first dielectric resonator 60 set at an arbitrary frequency. The value of the external Q has been varied over a range of 1000 to 4000 in the reference experiments.

Figure 1:
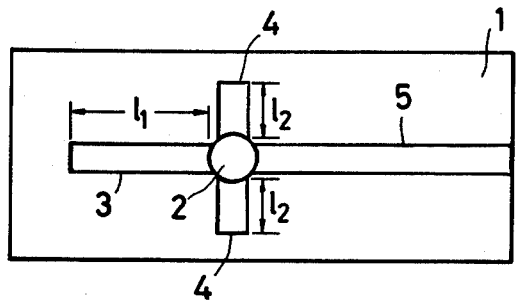
FIG. 1 is a front plan view of a first structure of a conventional microwave oscillator.
Figure 2:
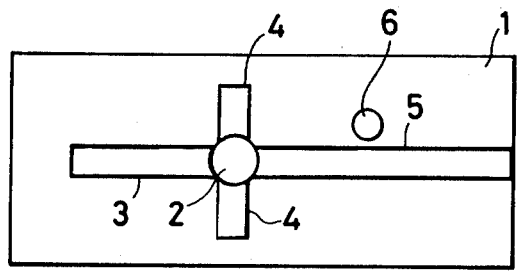
FIG. 2 is a front plan view of a second structure of a conventional microwave oscillator.
Figure 3:
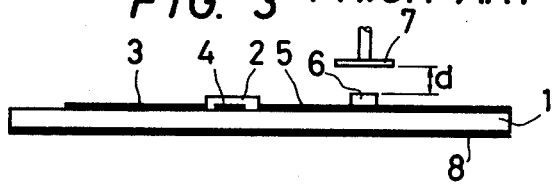
FIG. 3 is a side view of a third structure of a conventional microwave oscillator.
Figure 4:
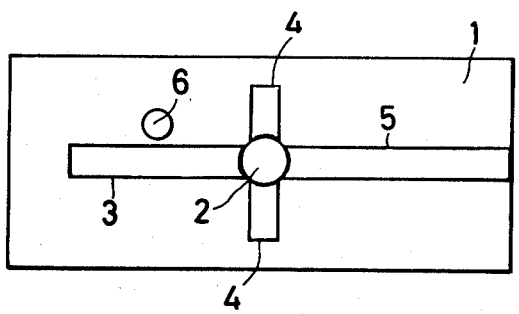
FIG. 4 is a front plan view of a fourth structure of a conventional microwave oscillator.
Figure 5:
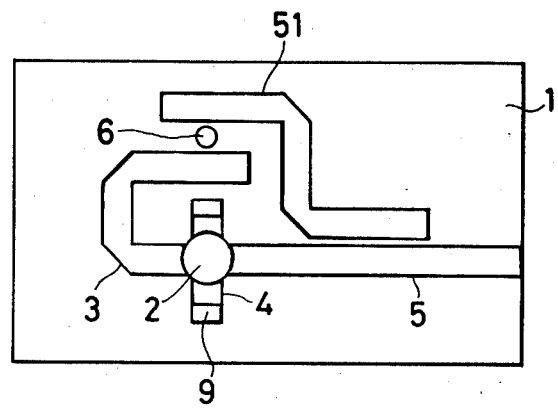
FIG. 5 is a front plan view of a fifth structure of a conventional microwave oscillator.

To the contrary, it is impossible in the prior oscillator shown in FIG. 2 to provide an oscillating frequency and an external Q independent of each other because the oscillating frequency varies automatically when both the resonant frequency of the dielectric oscillator and external Q vary at the same time. As described above, with the prior art, there are significant problems in practical implementation and it was almost impossible to provide a desired stability of the external Q at an arbitrary oscillating frequency. In distinct contrast, the embodiment shown in FIG. 7 easily provides stability at an arbitrary oscillating frequency and can readily be put to practical use.

An oscillator according to the present invention may be operated using two power sources of opposite polarity or a single power source of positive or negative polarity. A bias voltage applying means using a positive power source will next be explained.

Figure 8:
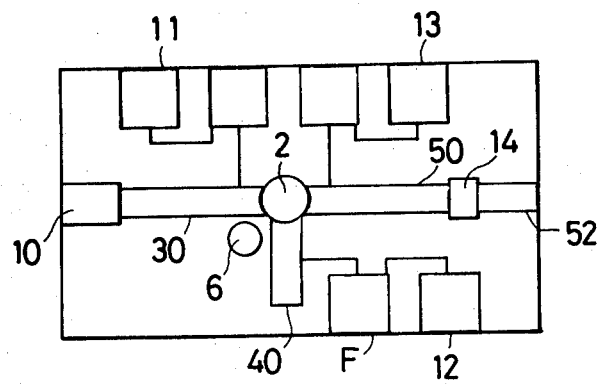
FIG. 8 is a front plan view of a third embodiment of a microwave oscillator according to the present invention.

A gate bias terminal 11, a drain bias terminal 12 and a source bias terminal 13 are connected to the transmission lines 30, 40 and 50, respectively, through low pass filters F as shown in FIG. 8.

In FIG. 8, a condenser 14 which cuts off direct voltage is connected between the transmission line 50 and an output terminal 52 so as to prevent a source bias voltage from reaching the output terminal. In other words, the condenser 14 separates the transmission line 50 from the output terminal 52 for direct voltage while it connects the transmission line 50 to the output terminal 52 for high frequency signals.

Figure 9:
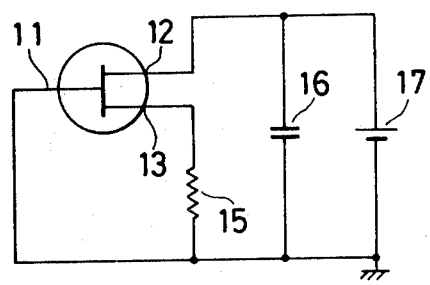
FIG. 9 and FIG. 10 illustrate embodiments of electric circuits applied to microwave oscillators according to the present invention.

A circuit for applying bias voltage to this oscillator is shown in FIG. 9. As shown in FIG. 9, a first terminal of a resistor 15 is connected to the source terminal 13 while the other terminal of the resistor 15 is connected to the gate terminal 11 and to ground. When a power source 17 is connected between the drain terminal 12 and the other terminal of the resistor 15, the oscillator is activated.

Figure 10:
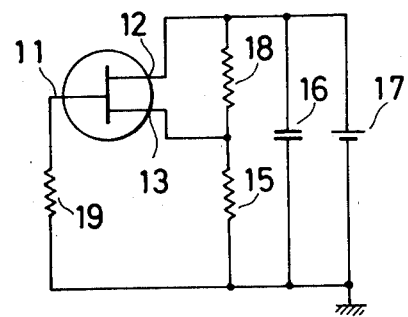

A condenser 16 connected between the output terminals of the power source 17 is provided for maintaining good oscillation though it is not necessary for ordinary oscillation conditions. A resistor 15 having a resistance value of about 10Ω is favorable for a GaAs FET with about 100 mA of $I_{DSS}$ value. The condenser 16 may favorably have a capacitance of about 0.1 μF. FIG. 10 shows another example of a bias circuit which has a resistor 18 and a resistor 19 in addition to the circuit of FIG. 9. In the bias circuit shown in FIG. 9, the voltage between the gate terminal 11 and the source terminal 13 cannot be adjusted because the voltage between the gate and the source is determined by the current through the resistor 15. The additional resistor 18 is provided to adjust the voltage between the gate terminal 13 and the source terminal 11. The resistor 19 is provided to prevent a large current from flowing through the gate terminal 11. The resistors for applying bias voltage and the condenof chip resistances and a chip condenser disposed on planar circuits. Further, the matching impedance 10 and the resistors for applying bias voltage may be formed of metal film disposed on the planar circuit.

Figure 11:
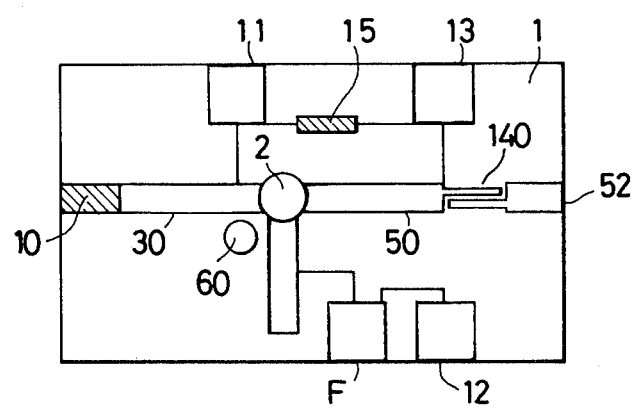
FIG. 11 is a front plan view of a fourth embodiment of a microwave oscillator according to the present invention.

FIG. 11 shows a planar circuit oscillator which includes resistors made of chromium film. The resistors are indicated by oblique line regions in FIG. 11. The example in FIG. 11 shows a DC cut line 140 which is formed as a transmission line instead of the condenser so as to block the passage of direct current voltage. This arrangement enables a fundamental oscillator circuit to be fabricated on the substrate 1 using a photo-etching process thereby improving the reliability and mass productivity of the circuit. The FET 2 and a dielectric resonator 60 are physically connected to the circuit following the application of the photo-etching process.

A GaAs FET is generally sealed in a ceramic package. However, in the above-described oscillator, an FET chip can be mounted directly on a planar circuit eliminating the requirement for separate package mounting reducing the packaging cost and also improving reliability and productivity.

In the above described embodiments, transmission lines 30, 40 and 50 which are connected to the gate electrode, source electrode and drain electrode, respectively, are constructed in such a way that they have the same characteristic impedance. However, the results of the described experiments revealed and the desirability of providing the transmission lines 30, 40 and 50 with slight differences in characteristic impedances. Good oscillations have been produced by making the characteristic impedance Zg, Zd and Zs of the gate, drain and the source transmission lines to be 50Ω, 40Ω and 30Ω respectively. The value of the characteristic impedance, however, may be adjusted according to the characteristics of the FET used in the oscillator.

Because the end of the source transmission line acts as an output terminal, the output impedance of the source transmission line should be converted to 50Ω which is a normal value of line impedance. A quarter-wavelength converter or a taper converter may be used as an impedance converter.

What is claimed is:
1. A microwave oscillator comprising:
   a planar substrate;
   a field effect transistor having a gate electrode, a drain electrode and a source electrode disposed on the substrate;
   an elongated gate transmission line connected to the gate electrode of the field effect transistor and disposed on the substrate;
   a matching impedance for terminating said gate transmission line;
   an elongated drain transmission line connected to the drain electrode of the field effect transistor disposed on the substrate at a predetermined angle to the gate transmission line;
   an elongated source transmission line connected to the source electrode and disposed on the substrate and producing the oscillating output; and
   a dielectric resonator disposed within said angle formed between the gate transmission line and the drain transmission line, said angle being substantially a right angle.

2. The microwave oscillator of claim 1 wherein the field effect transistor is a GaAs field effect transistor.

3. The microwave oscillator of claim 1 wherein the dielectric resonator is disposed apart from the gate transmission line and the drain transmission line.

4. The microwave oscillator of claim 1 wherein the matching impedance is formed of a metal film disposed on the substrate.

5. The microwave oscillator of claim 1 wherein the field effect transistor is a semiconductor chip directly disposed on the substrate.

6. The microwave oscillator of claim 1 wherein the relation among characteristic impedance Zg of the gate transmission line, characteristic impedance Zd of the drain transmission line and characteristic impedance Zs of the source transmission line is $Zg > Zd \geq Zs$.

7. A microwave oscillator comprising:
a planar substrate;
a field effect transistor having a gate electrode, a drain electrode and a source electrode and disposed on the substrate;
an elongated gate transmission line connected to the gate electrode of the field effect transistor and disposed on the substrate;
a matching impedance for terminating said gate transmission line;
an elongated drain transmission line connected to the drain electrode of the field effect transistor and disposed on the substrate at a predetermined angle to the gate transmission line, said angle being substantially a right angle;
a source transmission line connected to the source electrode and disposed on the substrate and producing the oscillating output;
a dielectric resonator disposed within said angle formed between the gate transmission line and the drain transmission line; and
a resistance connected between the source transmission line and the gate transmission line.

8. The microwave oscillator of claim 7 wherein the resistance is formed of a metal film disposed on the substrate.

9. The microwave oscillator of claim 8 wherein the matching impedance is formed of a metal film disposed on the substrate.

10. A microwave oscillator comprising;
a planar substrate;
a field effect transistor having a gate electrode, a drain electrode and a source electrode and disposed on the substrate;
an elongated gate transmission line connected to the gate electrode of the field effect transistor and disposed on the substrate;
a matching impedance for terminating said gate transmission line;
an elongated drain transmission line connected to the drain electrode of the field effect transistor and disposed on the substrate at a predetermined angle to the gate transmission line, said angle being substantially a right angle;
an elongated source transmission line connected to the source electrode and disposed on the substrate and producing the oscillating output;
a first dielectric resonator disposed within said angle formed between the gate transmission line and the drain transmission line; and
a second dielectric resonator disposed within an angle formed between the drain transmission line and the source transmission line.

* * * * *